United States Patent
Lee et al.

(10) Patent No.: US 10,839,896 B2
(45) Date of Patent: Nov. 17, 2020

(54) PROGRAMMING MULTIPLE-LEVEL MEMORY CELLS WITH MULTIPLE-PASS

(71) Applicant: MICRON TECHNOLOGY, INC., Boise, ID (US)

(72) Inventors: Changhyun Lee, Boise, ID (US); Akira Goda, Boise, ID (US); William C. Filipiak, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/228,904

(22) Filed: Dec. 21, 2018

(65) Prior Publication Data
US 2020/0202927 A1    Jun. 25, 2020

(51) Int. Cl.
*G11C 11/56*    (2006.01)
*G11C 16/10*    (2006.01)
*G11C 16/34*    (2006.01)
*G11C 16/04*    (2006.01)

(52) U.S. Cl.
CPC ...... *G11C 11/5628* (2013.01); *G11C 16/0483* (2013.01); *G11C 16/10* (2013.01); *G11C 16/3459* (2013.01); *G11C 2211/5621* (2013.01)

(58) Field of Classification Search
CPC . G11C 11/5628; G11C 16/0483; G11C 16/10; G11C 16/3459; G11C 2211/5621
See application file for complete search history.

(56) References Cited

U.S. PATENT DOCUMENTS

| | | | |
|---|---|---|---|
| 8,064,252 B2 | 11/2011 | Yip | |
| 8,345,482 B2 | 1/2013 | Hoei | |
| 8,819,337 B1* | 8/2014 | Oshinsky | G06F 11/1441 365/185.07 |
| 8,964,467 B1* | 2/2015 | Dusija | G11C 16/10 365/185.03 |
| 9,921,898 B1 | 3/2018 | Miller et al. | |
| 9,947,418 B2 | 4/2018 | Helm et al. | |
| 2012/0054582 A1* | 3/2012 | Byom | G06F 11/1072 714/773 |
| 2014/0223084 A1* | 8/2014 | Lee | G06F 12/0246 711/103 |
| 2014/0337574 A1* | 11/2014 | Cho | G06F 13/1668 711/114 |
| 2015/0155050 A1* | 6/2015 | Trantham | G11C 16/3418 365/185.03 |

* cited by examiner

*Primary Examiner* — Sultana Begum
(74) *Attorney, Agent, or Firm* — Dicke, Billig & Czaja, PLLC

(57) ABSTRACT

One embodiment of a method for programming multiple-level memory cells includes programming lower page data to memory cells in a first pass of a multiple-pass programming operation. The method includes reprogramming the lower page data to the memory cells prior to programming higher page data to the memory cells in a second pass of the multiple-pass programming operation.

7 Claims, 12 Drawing Sheets

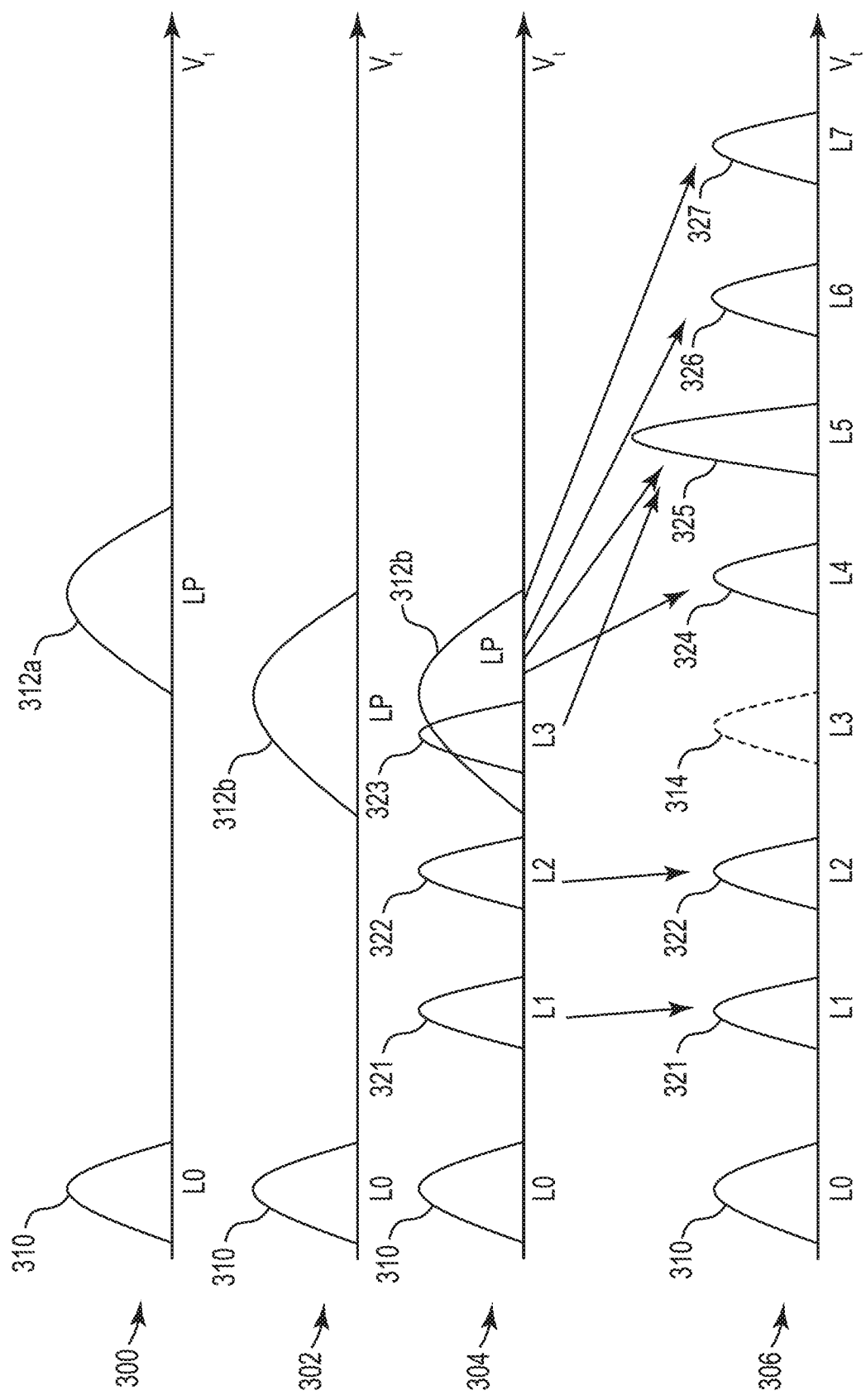

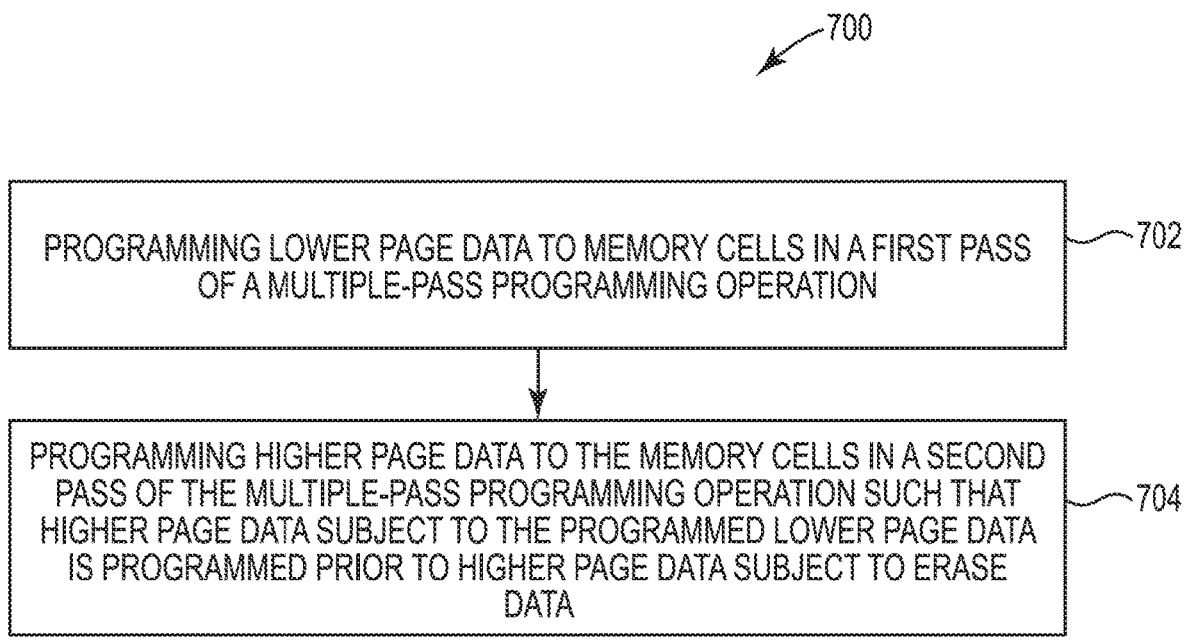

PROGRAMMING MULTIPLE-LEVEL MEMORY CELLS WITH MULTIPLE-PASS

TECHNICAL FIELD

The present disclosure relates generally to memory and, in particular, in one or more embodiments, the present disclosure relates to apparatus and methods to program multiple-level memory cells.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges.

In each pass, programming typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

In a multiple-pass programming operation, the threshold voltage of the lower page programmed cells may shift down due to the charge loss mechanism. In this case, when higher page data is programmed to the memory cells in a second pass of the multiple-pass programming operation, the memory cells with a program level closest to the lower page programmed cells may overlap with the existing lower page programmed cells. If a power loss occurs before completing programming of the higher page data, when the power is restored the threshold voltages of the overlapped memory cells cannot be distinguished from each other, which may result in data loss.

For the reasons stated above, and for other reasons stated below which will become apparent to those skilled in the art upon reading and understanding the present specification, there is a need in the art for alternative methods for programming multiple-level memory cells and system and apparatus to perform such methods.

BRIEF DESCRIPTION OF THE DRAWINGS

FIG. 3 depicts representations of populations of memory cells at various stages of a programming operation according to an embodiment.

FIGS. 11A-11B are flow diagrams illustrating another embodiment of a method for programming multiple-level memory cells.

DETAILED DESCRIPTION

Figure 1:
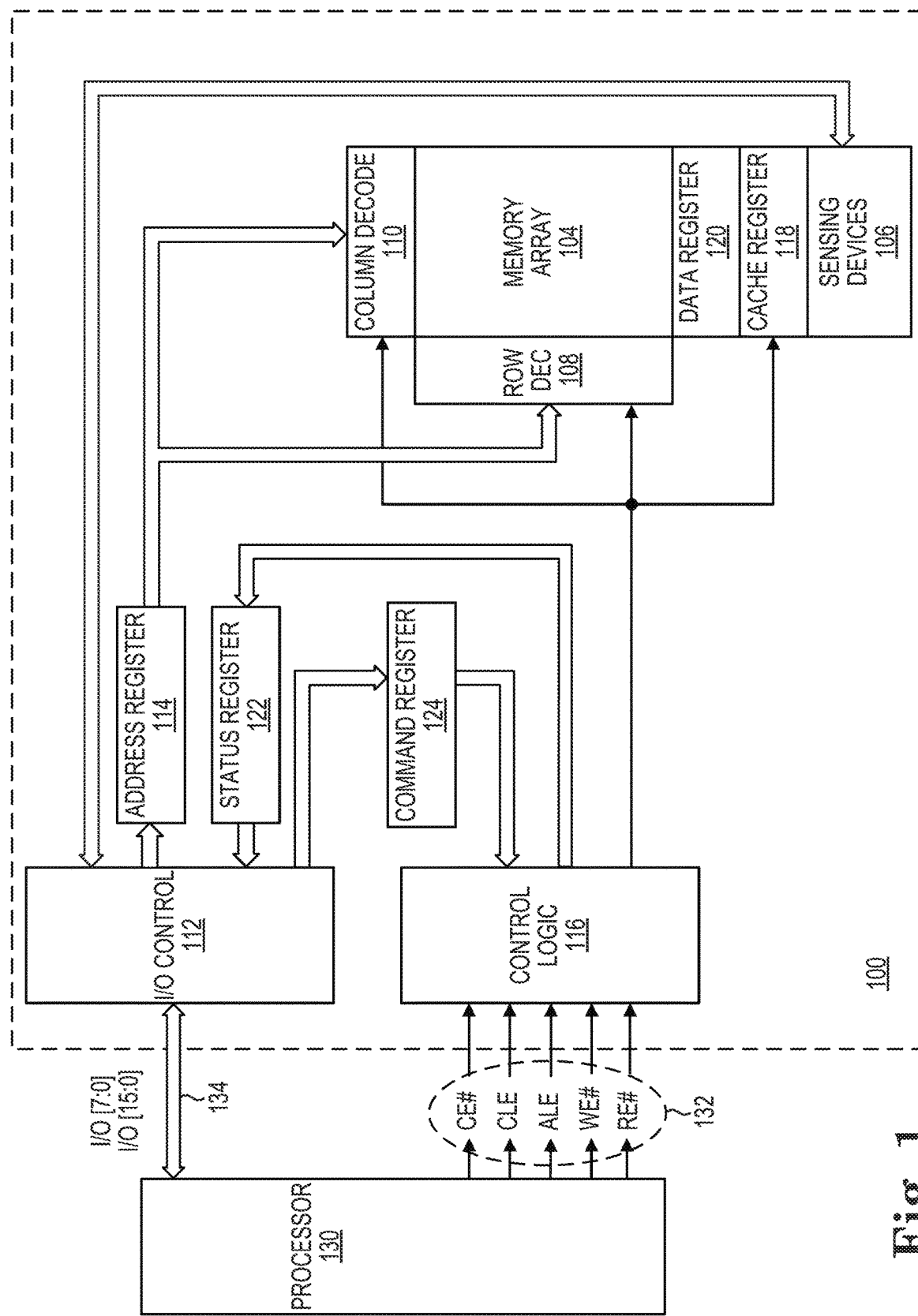
FIG. 1 is a simplified block diagram of one embodiment of a memory device in communication with a processor as part of an electronic system.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Disclosed herein are methods and apparatus for programming an array of multiple-level memory cells to prevent overlapping of the lower page data and the higher page data during multiple-pass programming operations. A controller of a memory device may be configured to program the multiple-level memory cells via a multiple-pass programming operation. In one embodiment, the controller is configured to program lower page data to the memory cells in a first pass and reprogram the lower page data to the memory cells and program higher page data to the memory cells in a second pass. In another embodiment, the controller is configured to program lower page data to the memory cells in a first pass and program higher page data to the memory cells in a second pass such that memory cells to be programmed to higher levels are programmed prior to memory cells to be programmed to lower levels. In yet another embodiment, the controller is configured to program lower page data in a first pass and program higher page data in a second pass such that memory cells to be programmed to a higher level are programmed in parallel with memory cells to be programmed to a lower level.

FIG. 1 is a simplified block diagram of a first apparatus, in the form of a memory device 100, in communication with a second apparatus, in the form of a processor 130, as part of a third apparatus, in the form of an electronic system, according to an embodiment. Some examples of electronic systems include personal computers, tablet computers, digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically coupled to the same access line (commonly referred to as a word line) while memory cells of a logical column are typically selectively coupled to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes I/O control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

An internal controller (e.g., control logic 116) controls access to the array of memory cells 104 in response to the commands and generates status information for the external processor 130, i.e., control logic 116 is configured to perform access operations in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from sensing devices 106 to the cache register 118. The data is then passed from the cache register 118 to data register 120 for transfer to the array of memory cells 104; then new data is latched in the cache register 118 from sensing devices 106, which receive the new data from the I/O control circuitry 112. During a read operation, data is passed from the cache register 118 to sensing devices 106, which pass the data to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE #, a command latch enable CLE, an address latch enable ALE, a write enable WE #, and a read enable RE #. Additional control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118 through sensing devices 106. The data are subsequently written into data register 120 for programming the array of memory cells 104. For another embodiment, cache register 118 may be omitted, and the data are written directly into data register 120 through sensing devices 106. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
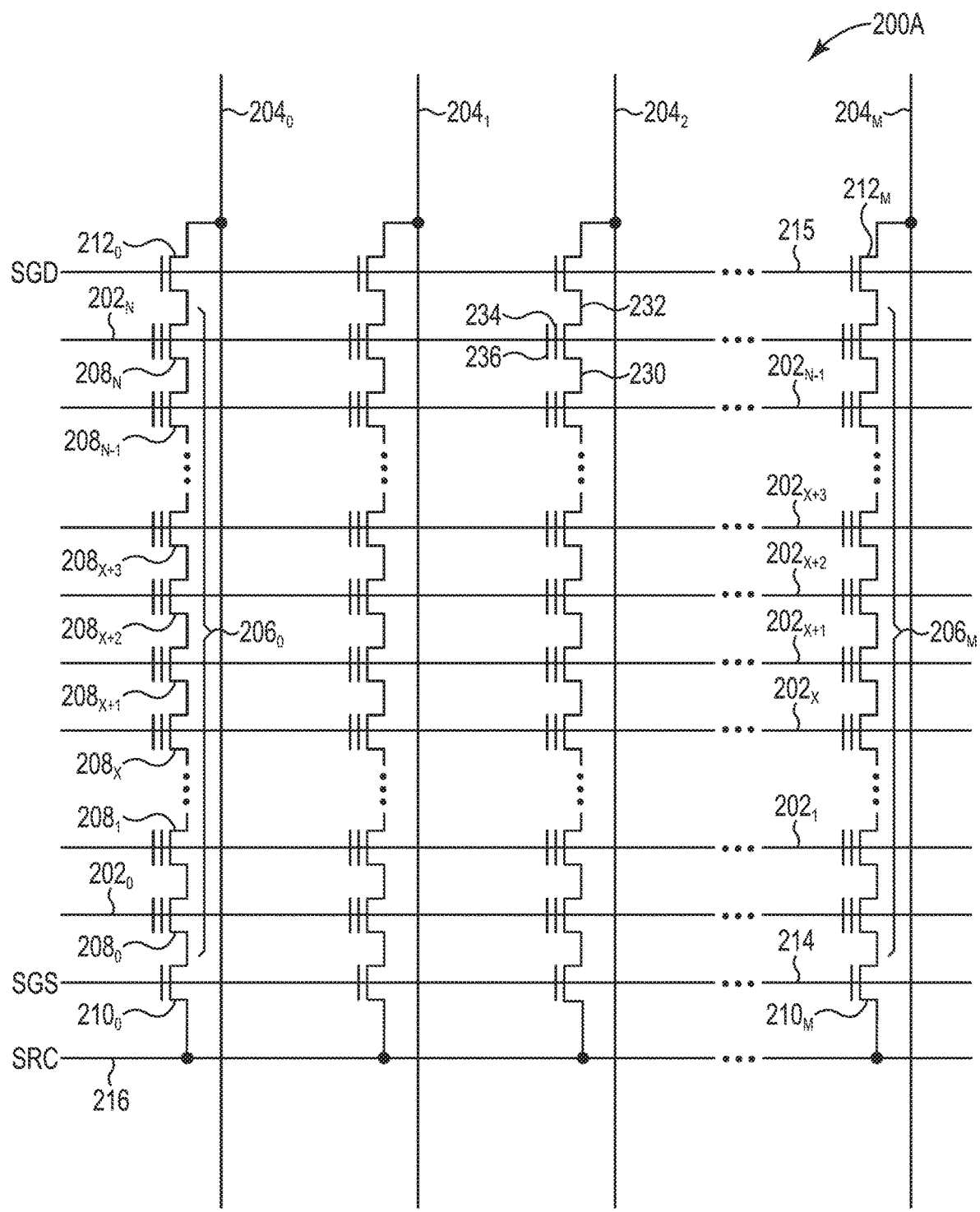
FIGS. 2A-2B are schematic diagrams of portions of an array of memory cells as could be used in a memory device of the type described with reference to FIG. 1.

FIG. 2A is a schematic of a NAND memory array 200A, e.g., as a portion of array of memory cells 104. Memory array 200A includes access lines, such as word lines $202_0$ to $202_N$, and data lines, such as bit lines $204_0$ to $204_M$. The word lines 202 may be coupled to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-coupled memory cells, such as one of NAND strings $206_0$ to $206_M$. Each NAND string 206 might be coupled to a common source 216 and might include memory cells $208_0$ to $208_N$. The memory cells 208 represent non-volatile memory cells for storage of data. The memory cells 208 of each NAND string 206 might be connected in series between a select transistor 210 (e.g., a field-effect transistor), such as one of the select transistors $210_0$ to $210_M$ (e.g., that may be source select transistors, commonly referred to as select gate source), and a select transistor 212 (e.g., a field-effect transistor), such as one of the select transistors $212_0$ to $212_M$ (e.g., that may be drain select transistors, commonly referred to as select gate drain). Select transistors $210_0$ to $210_M$ might be commonly coupled to a select line 214, such as a source select line, and select transistors $212_0$ to $212_M$ might be commonly coupled to a select line 215, such as a drain select line.

A source of each select transistor 210 might be connected to common source 216. The drain of each select transistor 210 might be connected to the source of a memory cell $208_0$ of the corresponding NAND string 206. For example, the drain of select transistor $210_0$ might be connected to the source of memory cell $208_0$ of the corresponding NAND string $206_0$. Therefore, each select transistor 210 might be configured to selectively couple a corresponding NAND string 206 to common source 216. A control gate of each select transistor 210 might be connected to select line 214.

The drain of each select transistor 212 might be connected to the bit line 204 for the corresponding NAND string 206. For example, the drain of select transistor $212_0$ might be connected to the bit line $204_0$ for the corresponding NAND string $206_0$. The source of each select transistor 212 might be connected to the drain of a memory cell $208_N$ of the corresponding NAND string 206. For example, the source of select transistor $212_0$ might be connected to the drain of memory cell $208_N$ of the corresponding NAND string $206_0$. Therefore, each select transistor 212 might be configured to selectively couple a corresponding NAND string 206 to a corresponding bit line 204. A control gate of each select transistor 212 might be connected to select line 215.

The memory array in FIG. 2A might be a quasi-two-dimensional memory array and might have a generally planar structure, e.g., where the common source 216, strings 206 and bit lines 204 extend in substantially parallel planes. Alternatively, the memory array in FIG. 2A might be a three-dimensional memory array, e.g., where strings 206 may extend substantially perpendicular to a plane containing the common source 216 and to a plane containing the bit lines 204 that may be substantially parallel to the plane containing the common source 216.

Typical construction of memory cells 208 includes a data-storage structure 234 (e.g., a floating gate, charge trap, etc.) that can determine a data value of the cell (e.g., through changes in threshold voltage), and a control gate 236, as shown in FIG. 2A. Memory cells 208 may further have a defined source 230 and a defined drain 232. Memory cells 208 have their control gates 236 coupled to (and in some cases form) a word line 202.

A column of the memory cells 208 is a NAND string 206 or a plurality of NAND strings 206 coupled to a given bit line 204. A row of the memory cells 208 are memory cells 208 commonly coupled to a given word line 202. A row of memory cells 208 can, but need not include all memory cells 208 commonly coupled to a given word line 202. Rows of memory cells 208 may often be divided into one or more groups of physical pages of memory cells 208, and physical pages of memory cells 208 often include every other memory cell 208 commonly coupled to a given word line 202. For example, memory cells 208 commonly coupled to word line $202_N$ and selectively coupled to even bit lines 204 (e.g., bit lines $204_0$, $204_2$, $204_4$, etc.) may be one physical page of memory cells 208 (e.g., even memory cells) while memory cells 208 commonly coupled to word line $202_N$ and selectively coupled to odd bit lines 204 (e.g., bit lines $204_1$, $204_3$, $204_5$, etc.) may be another physical page of memory cells 208 (e.g., odd memory cells). Although bit lines $204_3$-$204_5$ are not expressly depicted in FIG. 2A, it is apparent from the figure that the bit lines 204 of the array of memory cells 200A may be numbered consecutively from bit line $204_0$ to bit line $204_M$. Other groupings of memory cells 208 commonly coupled to a given word line 202 may also define a physical page of memory cells 208. For certain memory devices, all memory cells commonly coupled to a given word line might be deemed a physical page. The portion of a physical page (which, in some embodiments, could still be the entire row) that is read during a single read operation or programmed during a program operation (e.g., an upper or lower page memory cells) might be deemed a logical page.

Figure 2B:
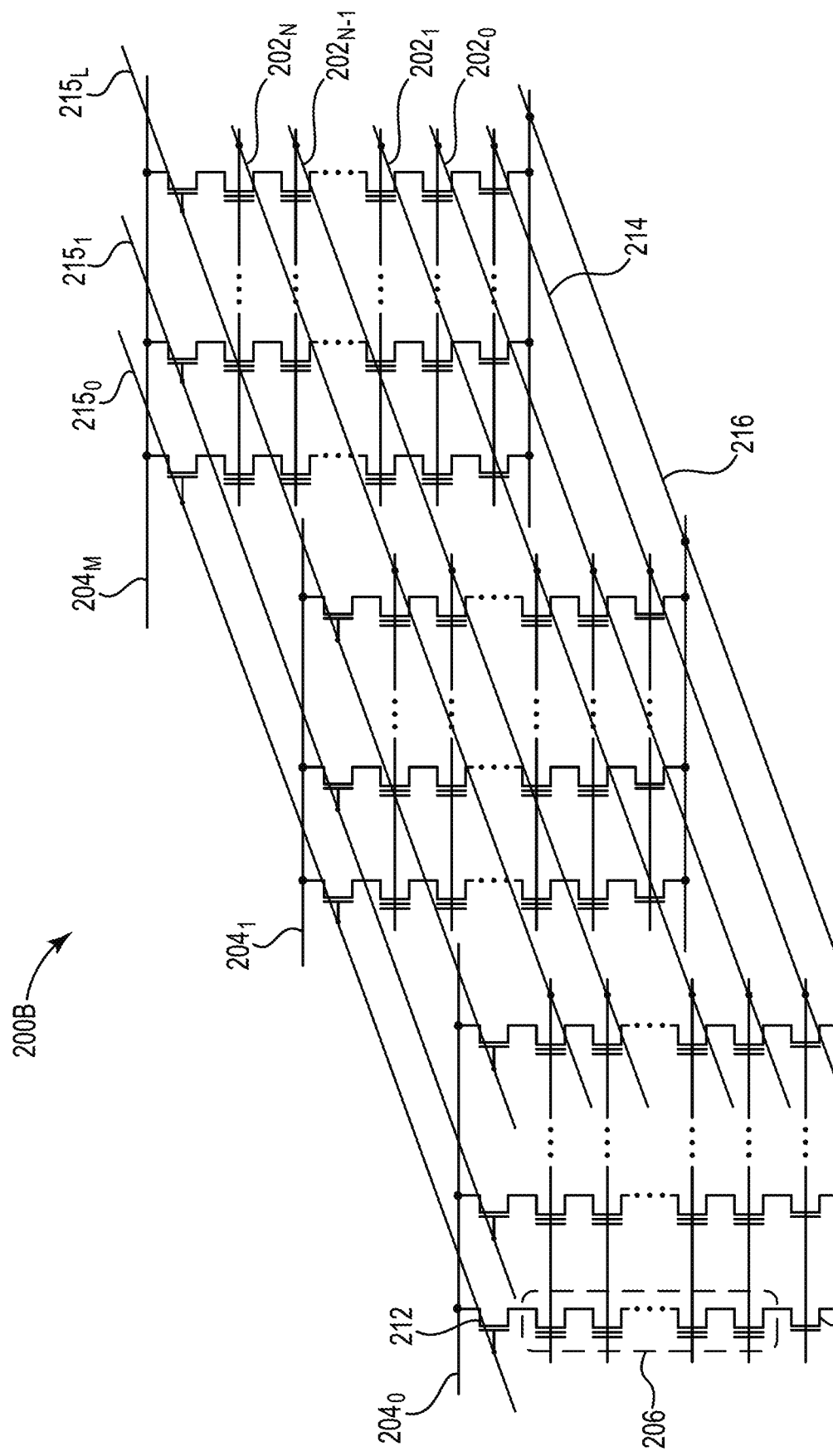

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$ to $204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$ to $215_L$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Although the examples of FIGS. 2A-2B are discussed in conjunction with NAND flash, the embodiments described herein are not limited to a particular array architecture or structure, and can include other structures (e.g., cross-point memory, DRAM, etc.) and other architectures (e.g., AND arrays, NOR arrays, etc.).

FIG. 3 depicts representations of populations of memory cells at various stages of a programming operation according to an embodiment. In this example, a two to eight state multiple-pass programming operation is used to program a TLC memory. The memory cells of a page of memory cells might be erased to each have a threshold voltage representing an erased data state. This population of erased memory cells is indicated at 310 and represent a level 0 (L0) data state. The first pass, indicated at 300, of a programming operation for a TLC memory might involve loading lower page data and programming that lower page data. As a result, the population of memory cells might be programmed to their respective desired data states corresponding to a population of memory cells 310 representing the L0 data state and a population of memory cells 312a representing a lower page (LP) data state. After the first pass, as indicated at 302, the threshold voltage of the LP programmed memory cells 312a may shift down as indicated by a population of memory cells 312b. This shift down in the threshold voltage of the LP programmed memory cells might be due to the charge loss mechanism and the time interval between the first and second passes of a multiple-pass programming operation. The time interval between the first and second passes of the multiple-pass programming operation may be anywhere between a few milliseconds and an end of life of the memory device on the order of years.

The second pass, indicated at 304, of the programming operation for the TLC memory might involve loading higher page data (e.g., upper page data and extra page data) and programming that higher page data. As a result, a portion of the L0 programmed memory cells 310 might be programmed to their respective desired data states corresponding to a population of memory cells 321 representing a level 1 (L1) data state, a population of memory cells 322 representing a level 2 (L2) data state, and a population of memory cells 323 representing a level 3 (L3) data state. However, due to the threshold voltage of the LP programmed memory cells 312b having shifted down, the threshold voltage of the L3 programmed memory cells 323 may overlap the threshold voltage of the LP programmed memory cells 312b. If a power loss occurs before completing programming of the higher page data, the overlapping threshold voltages of the L3 programmed memory cells 323 and the LP programmed memory cells 312b cannot be distinguished from each other when power is restored.

When power is restored, the incomplete programming of the higher page data is reinstated as indicated at 306. With the higher page data programming reinstated, the LP programmed memory cells 312b might be programmed to their respective desired data states corresponding to a population of memory cells 324 representing a level 4 (L4) data state, a population of memory cells 325 representing a level 5 (L5) data state, a population of memory cells 326 representing a level 6 (L6) data state, and a population of memory cells 327 representing a level 7 (L7) data state. However, since the threshold voltage of the L3 programmed memory cells 323 overlaps the threshold voltage of the LP programmed memory cells 312b, the L3 programmed memory cells 323 might be misplaced (i.e., programmed incorrectly) as indicated, for example, by the larger number of L5 programmed memory cells 325 when the programming of the higher page data is reinstated. In this way, the L3 programmed memory cells might be missing as indicated at 314, when the programming of the higher page data is reinstated, thus resulting in data loss. The various modifications to the multiple-pass programming operation described below with reference to FIGS. 4-8B prevent overlapping of the L3 programmed memory cells 323 and the LP programmed memory cells 312b such that when the programming of the higher page data is reinstated after power is restored, the L3 programmed memory cells 323 are not misplaced.

The population of memory cells 310 might represent a logical data value of '111', the population of memory cells 321 might represent a logical data value of '011', the population of memory cells 322 might represent a logical data value of '001', the population of memory cells 323 might represent a logical data value of '101', the population of memory cells 324 might represent a logical data value of '100', the population of memory cells 325 might represent a logical data value of '000', the population of memory cells 326 might represent a logical data value of '010', and the population of memory cells 327 might represent a logical data value of '110', where the right-most digit might represent the lower page data for a memory cell having a threshold voltage within the threshold voltage range of its respective population of memory cells, the center digit might represent the upper page data for that memory cell, and the left-most digit might represent the extra page data for that memory cell. As is understood in the art, data states of memory cells within the populations of memory cells 310 and 321-327 may be determined by applying different read voltages and sensing for activation of the memory cells at the respective voltages. Although a specific example of binary representation is provided, embodiments may use other arrangements of bit patterns to represent the various data states.

Figure 4:
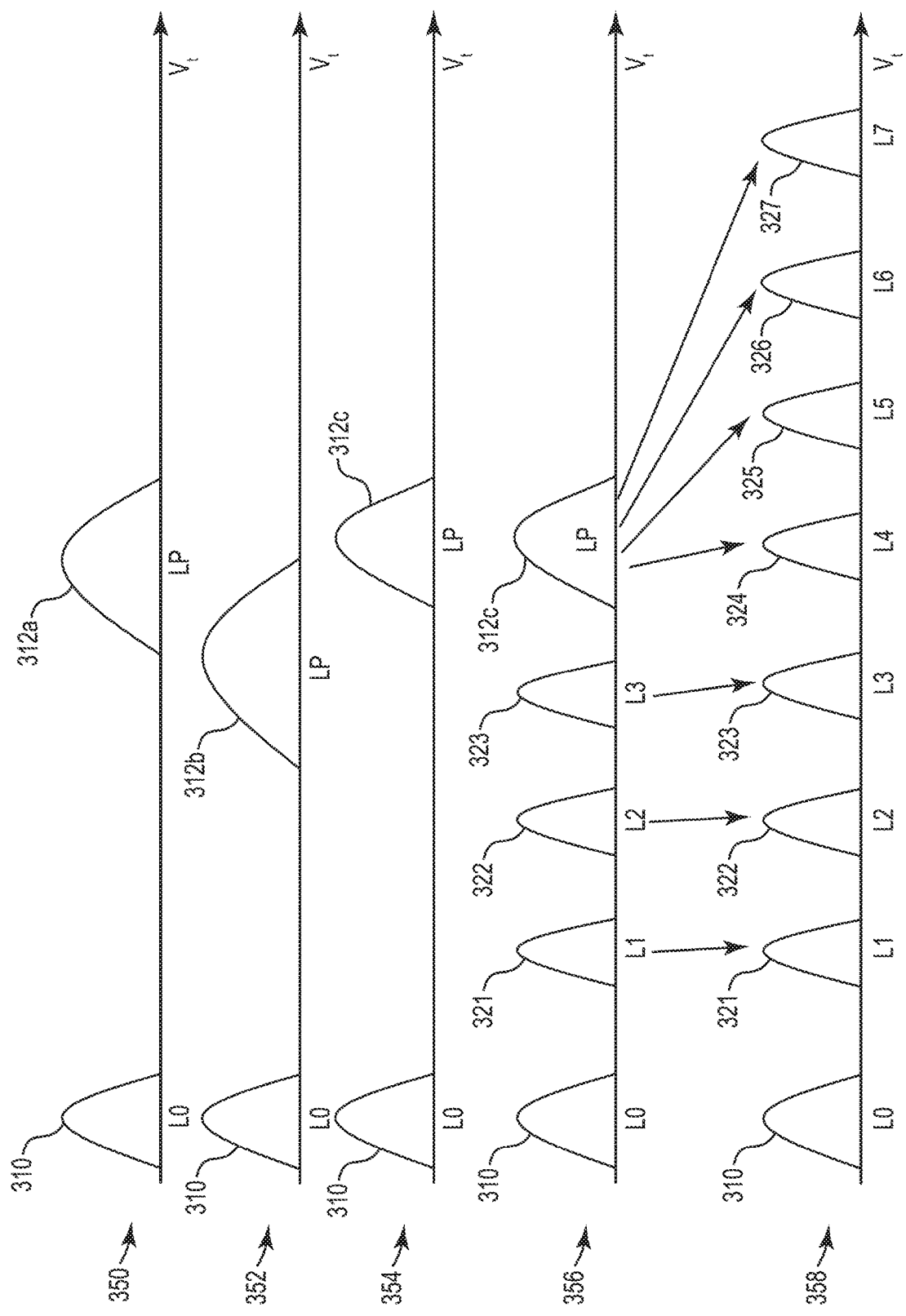
FIG. 4 depicts representations of populations of memory cells at various stages of a programming operation according to another embodiment.

FIG. 4 depicts representations of populations of memory cells at various stages of a programming operation according to another embodiment. In this embodiment, a controller (e.g., control logic 116 of FIG. 1) may be configured to program the multiple-level memory cells via a multiple-pass programming operation. The multiple-pass programming operation programs lower page data to the memory cells in a first pass and reprograms the lower page data to the memory cells and programs higher page data to the memory cells in a second pass as described below for a TLC memory.

The memory cells of a page of memory cells might be erased to each have a threshold voltage representing an erased data state. This population of erased memory cells is indicated at 310 and represent a L0 data state. The first pass, indicated at 350, of a programming operation for a TLC memory might involve loading lower page data and programming that lower page data. As a result, the population of memory cells might be programmed to their respective desired data states corresponding to a population of memory cells 310 representing the L0 data state and a population of memory cells 312a representing a LP data state. After the first pass, as indicated at 352, the threshold voltage of the LP programmed memory cells 312a may shift down as indicated by a population of memory cells 312b as previously described with reference to FIG. 3.

The second pass, indicated at 354, of the programming operation for the TLC memory might involve first reprogramming the lower page data. As a result, the threshold voltages of the LP programmed memory cells 312b are shifted back up as indicated by the population 312c of LP programmed memory cells. The reprogramming of the LP programmed memory cells may include programming by a program-verify operation or by blind pulses without a verify operation.

The second pass of the programming operation then may continue, as indicated at 356, which might involve loading higher page data (e.g., upper page data and extra page data) and programming that higher page data. As a result, a portion of the L0 programmed memory cells 310 might be programmed to their respective desired data states corresponding to a population of memory cells 321 representing a L1 data state, a population of memory cells 322 representing a L2 data state, and a population of memory cells 323 representing a L3 data state. However, due to the threshold voltage of the LP programmed memory cells 312c having been shifted up, the L3 programmed memory cells 323 do not overlap the LP programmed memory cells 312c. If a power loss occurs before completing programming of the higher page data, the L3 programmed memory cells 323 can be distinguished from the LP programmed memory cells 312c when power is restored. Thus, when programming of the higher page data is reinstated when power is restored, no data is lost.

When power is restored, the incomplete programming of the higher page data may be reinstated as indicated at 358. With the higher page data programming reinstated, the LP programmed memory cells 312c might be programmed to their respective desired data states corresponding to a population of memory cells 324 representing a L4 data state, a population of memory cells 325 representing a L5 data state, a population of memory cells 326 representing a L6 data state, and a population of memory cells 327 representing a L7 data state.

In another embodiment, the controller may be configured to skip the reprogramming of the lower page data to the memory cells in the second pass in response to a threshold voltage of the LP programmed memory cells 312b being above a predetermined threshold voltage (i.e., the threshold voltage of the LP programmed memory cells 312b has not shifted down enough to result in the LP programmed memory cells 312b overlapping the L3 programmed memory cells 323).

Figure 5:
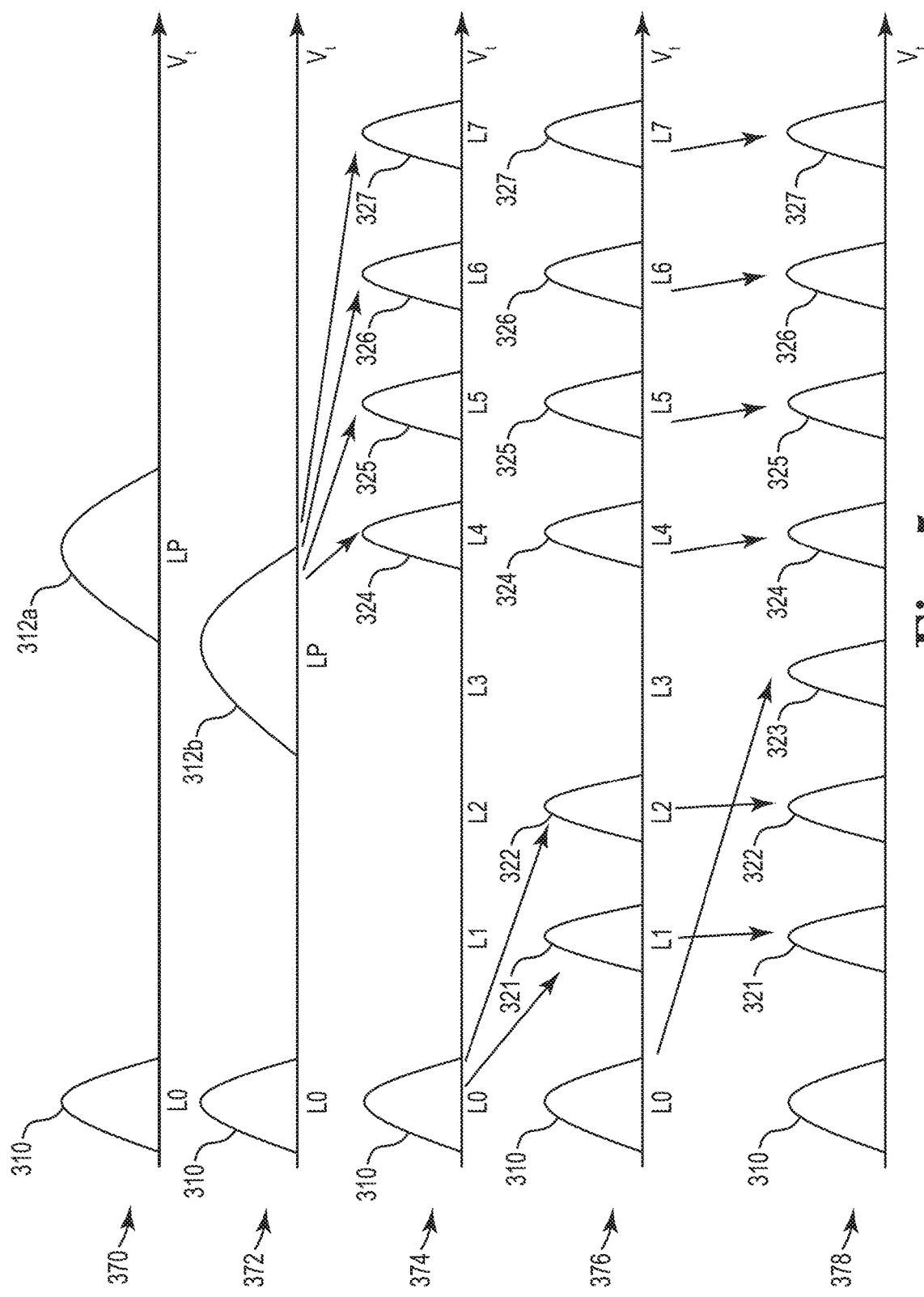
FIG. 5 depicts representations of populations of memory cells at various stages of a programming operation according to another embodiment.

FIG. 5 depicts representations of populations of memory cells at various stages of a programming operation according to another embodiment. In this embodiment, a controller (e.g., control logic 116 of FIG. 1) may be configured to program the multiple-level memory cells via a multiple-pass programming operation. The multiple-pass programming operation programs lower page data to the memory cells in a first pass and programs higher page data to the memory cells in a second pass such that memory cells to be programmed to higher levels are programmed prior to memory cells to be programmed to lower levels as described below for a TLC memory.

In this example, a two to eight state multiple-pass programming operation is used to program a TLC memory. The memory cells of a page of memory cells might be erased to each have a threshold voltage representing an erased data state. This population of erased memory cells is indicated at 310 and represent a L0 data state. The first pass, indicated at 370, of a programming operation for a TLC memory might involve loading lower page data and programming that lower page data. As a result, the population of memory cells might be programmed to their respective desired data states corresponding to a population of memory cells 310 representing the L0 state and memory cells 312a representing a LP data state. After the first pass, as indicated at 372, the threshold voltage of the LP programmed memory cells 312a may shift down as indicated by a population of memory cells 312b as previously described with reference to FIG. 3.

The second pass, indicated at 374, of the programming operation for the TLC memory might involve first programming the higher levels. The LP programmed memory cells 312b might be programmed to their respective desired data states corresponding to a population of memory cells 324 representing a L4 data state, a population of memory cells 325 representing a L5 data state, and a population of memory cells 326 representing a L6 data state, and a population of memory cells 327 representing a L7 data state. The second pass of the programming operation then may continue, as indicated at 376 and 378, which might involve programming the lower levels. As a result, a portion of the L0 programmed memory cells 310 might be programmed to their respective desired data states corresponding to a population of memory cells 321 representing a L1 data state, a population of memory cells 322 representing a L2 data state, and a population of memory cells 323 representing a L3 data state. However, due to the higher levels being programmed prior to the lower levels, the L3 programmed memory cells 323 do not overlap the LP programmed memory cells 312b. If a power loss occurs before completing programming of the higher page data at 376, the L3 programmed memory cells 323 can be distinguished from the L4 and higher programmed memory cells when power is restored at 378. Thus, when programming of the higher page data is reinstated when power is restored, no data is lost.

In another embodiment, the controller may be configured to program the higher page data to the memory cells in the second pass such that memory cells to be programmed to the lower levels are programmed prior to the memory cells to be programmed to the higher levels in response to a threshold voltage of the LP programmed memory cells 312b being above a predetermined threshold voltage (i.e., if the threshold voltage of the LP programmed memory cells 312b has not shifted down enough to result in the LP programmed memory cells 312b overlapping the L3 programmed memory cells 323, the lower levels L1, L2, and L3 may be programmed prior to the higher levels L4, L5, L6, and L7).

Figure 6:
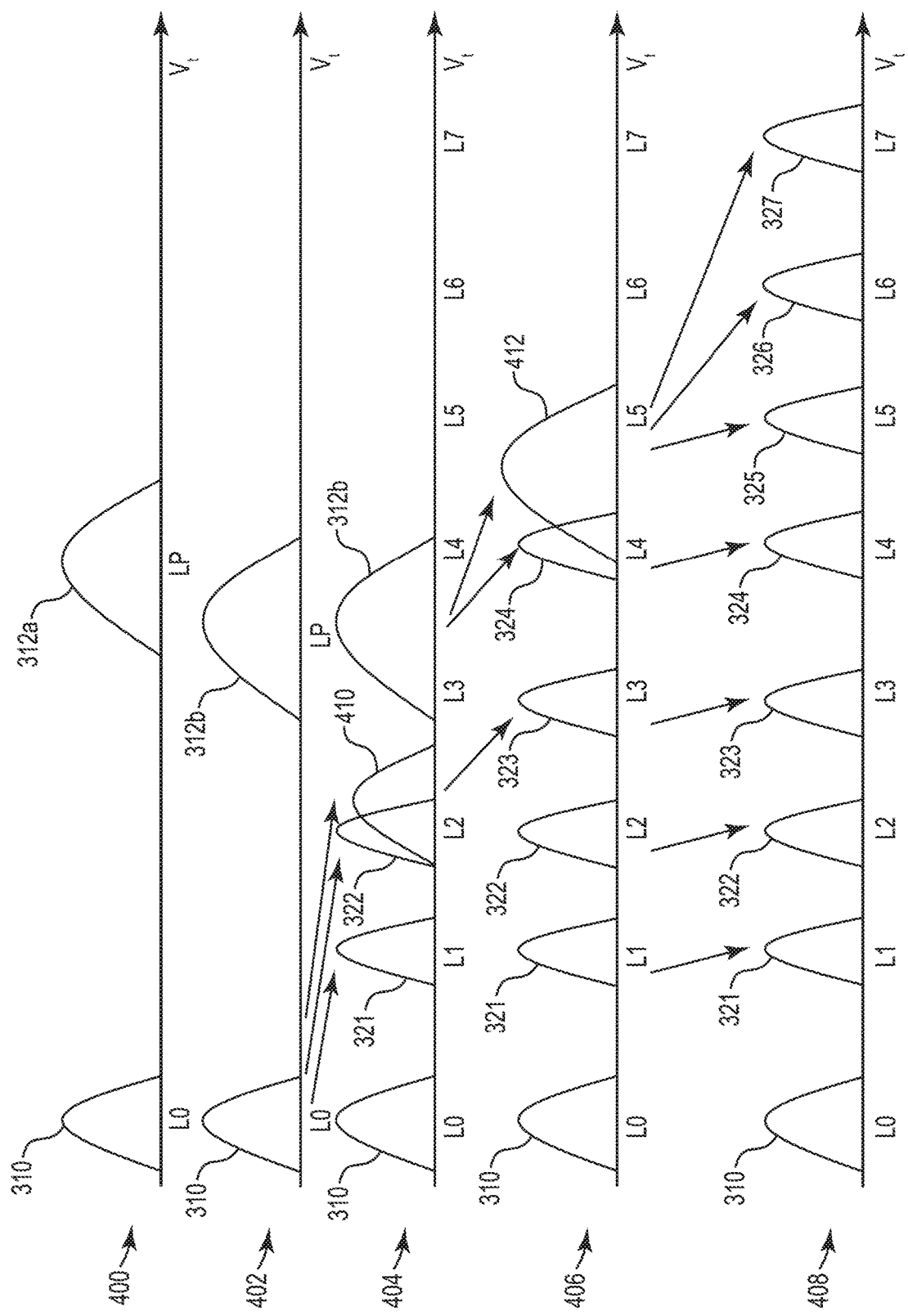
FIG. 6 depicts representations of populations of memory cells at various stages of a programming operation according to another embodiment.

FIG. 6 depicts representations of populations of memory cells at various stages of a programming operation according to another embodiment. In this embodiment, a controller (e.g., control logic 116 of FIG. 1) may be configured to program the multiple-level memory cells via a multiple-pass programming operation. The multiple-pass programming operation programs lower page data in a first pass and programs higher page data in a second pass such that memory cells to be programmed to a higher level are programmed in parallel with memory cells to be programmed to a lower level as described below for a TLC memory.

In this example, a two to eight state multiple-pass programming operation is used to program a TLC memory. The memory cells of a page of memory cells might be erased to each have a threshold voltage representing an erased data state. This population of erased memory cells is indicated at 310 and represent a L0 data state. The first pass, indicated at 400, of a programming operation for a TLC memory might involve loading lower page data and programming that lower page data. As a result, the population of memory cells might be programmed to their respective desired data states corresponding to a population of memory cells 310 representing the L0 data state and memory cells 312a representing a LP data state. After the first pass, as indicated at 402, the threshold voltage of the LP programmed memory cells 312a may shift down as indicated by a population of memory cells 312b as previously described with reference to FIG. 3.

The second pass begins, indicated at 404, by programming the lower levels. When memory cells to be programmed to the L3 data state begin to reach the L3 data state as indicated at 410, the memory cells to be programmed to the L3 data state and the memory cells to be programmed to the L4 data state are programmed in parallel as indicated at 406. As a result, a portion of the L0 programmed memory cells 310 might be programmed to their respective desired data states corresponding to a population of memory cells 321 representing a L1 data state, a population of memory cells 322 representing a L2 data state, and a population of memory cells 323 representing a L3 data state. In addition, the LP programmed memory cells 312b might be programmed to their respective desired data states corresponding to a population of memory cells 324 representing a L4 data state, a population of memory cells 325 representing a L5 data state, a population of memory cells 326 representing a L6 data state, and a population of memory cells 327 representing a L7 data state. However, due to the parallel programming of the memory cells representing the L3 and L4 data states, the L3 programmed memory cells 323 do not overlap the LP programmed memory cells 312b. If a power loss occurs before completing programming of the higher page data as indicated at 406, the L3 programmed memory cells 323 can be distinguished from the L4 programmed memory cells 324 and the remaining memory cells 412 not yet at their final data states. Thus, when programming of the higher page data is reinstated when power is restored as indicated at 408, no data is lost.

In another embodiment, the controller may be configured to program the higher page data in the second pass without programming memory cells to be programmed to the higher level in parallel with memory cells to be programmed to the lower level in response to a threshold voltage of the LP programmed memory cells 312b being above a predetermined threshold voltage (i.e., the threshold voltage of the LP programmed memory cells 312b has not shifted down enough to result in the LP programmed memory cells 312b overlapping the L3 programmed memory cells 323.)

Figure 7A:
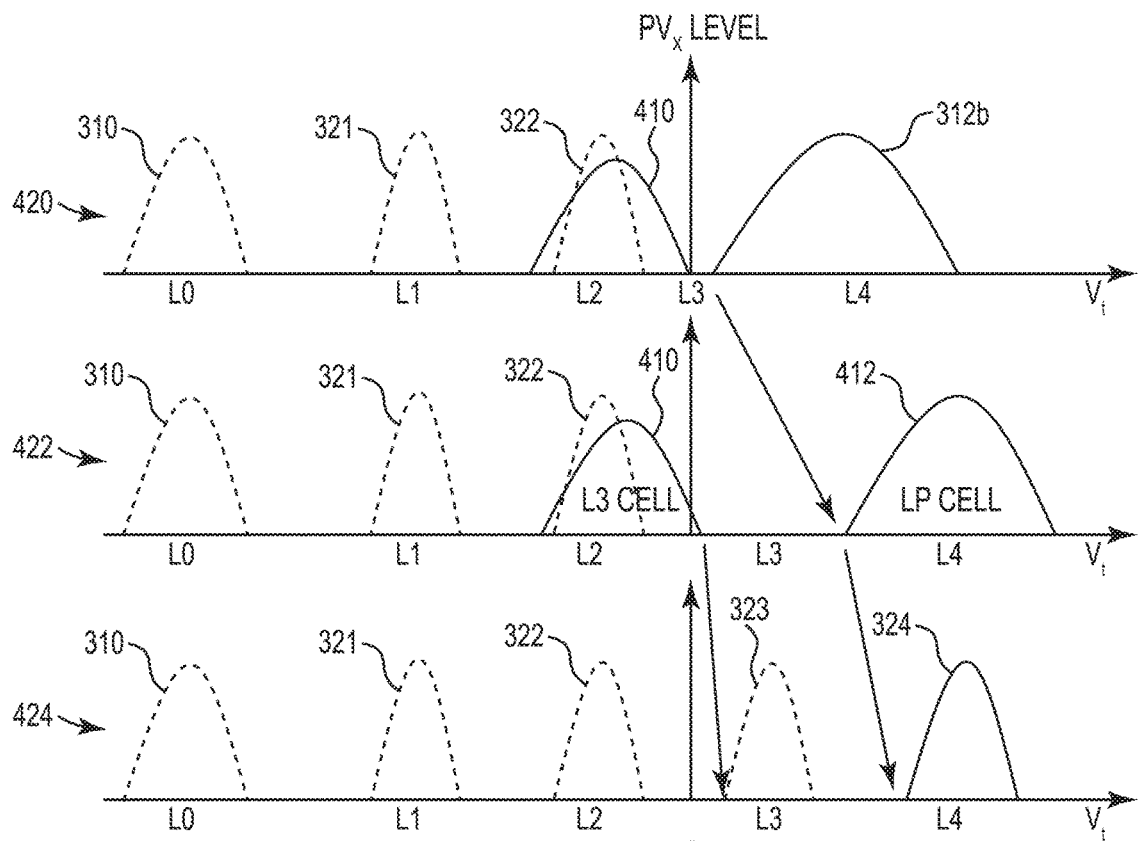
FIGS. 7A-7B depict a parallel programming operation according to an embodiment.
Figure 7B:
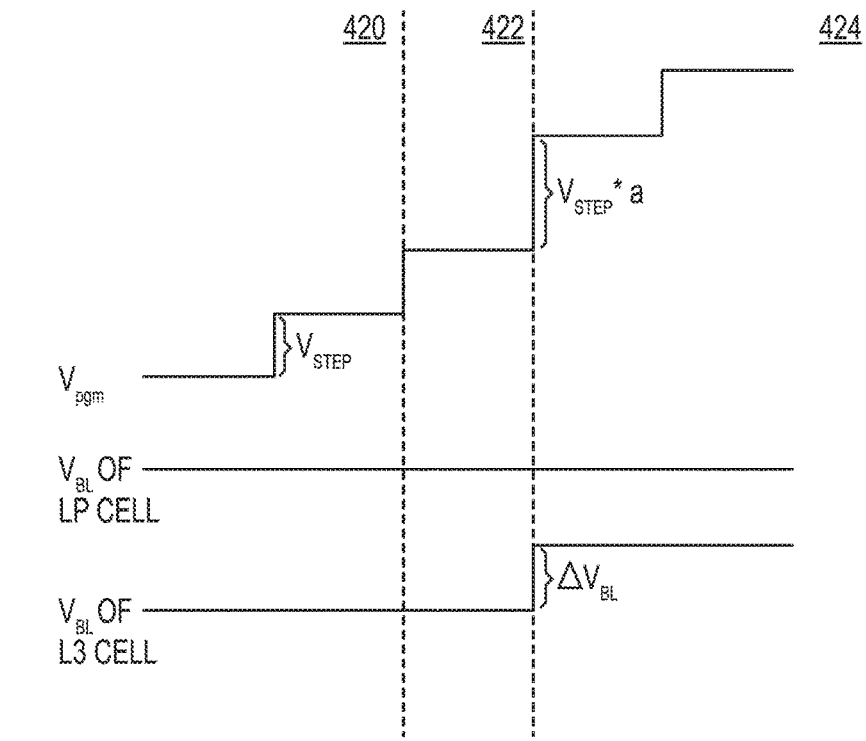

FIGS. 7A-7B depict a parallel programming operation according to an embodiment for the programming operation described with reference to FIG. 6. In this embodiment, a controller (e.g., control logic 116 of FIG. 1) may be configured to increase a voltage applied to bit lines of the memory cells to be programmed to a lower level (e.g., L3 data state) above a voltage applied to bit lines of the memory cells to be programmed to a higher level (e.g., L4 data state) such that the memory cells to be programmed to the higher level may be programmed prior to the memory cells to be programmed to the lower level.

As illustrated in FIGS. 7A and 7B at 420, the second pass of the multiple-pass programming operation begins by programming the memory cells to be programmed to the lower levels (e.g., L1 and L2). A bit line voltage $V_{BL}$ (e.g., 0V) is applied to the bit lines of the memory cells to be programmed including the LP programmed memory cells and the memory cells to be programmed to the L1, L2, and L3 data states. The bit line voltage for each corresponding memory cell is increased to the inhibit voltage level (e.g., Vcc) once each corresponding memory cell has reached its desired data state. Programming pulses $V_{PGM}$ are then applied to the selected word line to move selected L0 programmed memory cells 310 to the L1 data state 321, to the L2 data state 322, and toward the L3 data state as indicated at 410. When the memory cells to be programmed to the L3 data state as indicated at 410 begin to pass a predefined threshold voltage level $PV_X$ as indicated at 422, the memory cells to be programmed to the L3 data state and the L4 data state may be programmed in parallel.

In one example, the number of memory cells reaching the $PV_X$ level may be counted until the number exceeds a predefined number. In response to the number of memory cells reaching the $PV_X$ level exceeding the predefined number, the program voltage $V_{PGM}$ as illustrated in FIG. 7B may be increased by a voltage step $V_{STEP}*a$, where "a" is greater than or equal to 1. At the same time $V_{PGM}$ is increased by $V_{STEP}*a$, the bit line voltage of the memory cells to be programmed to the L3 data state is increased by a predefined voltage $\Delta V_{BL}$ (which is less than a voltage level configured to inhibit programming) so that the bit line voltage of the memory cells to be programmed to L3 data state is greater than the bit line voltage of the LP programmed memory cells 312b. The increased bit line voltage for the memory cells to be programmed to the L3 data state retards the programming speed of the memory cells to be programmed to the L3 data state. In this way, the LP programmed memory cells 312b are programmed toward the L4 data state as indicated at 412 before the memory cells to be programmed to the L3 data state reach the left tail of the LP programmed memory cell distribution. Thus, a gap in the threshold voltage may be maintained between the memory cells to be programmed to the L3 data state and the memory cells to be programmed to the L4 data state. Accordingly, the threshold voltage of the population of memory cells 323 programmed to the L3 data state do not overlap the threshold voltage of the population of memory cells 324 programmed to the L4 data state as indicated at 424, even if power is lost during the second pass of the multiple-pass programming operation and the programming of the higher page data is reinstated after power is restored.

As a result, in the second pass of the multiple-pass programming operation a portion of the L0 programmed memory cells 310 might be programmed to their respective desired data states corresponding to a population of memory cells 321 representing a L1 data state, a population of memory cells 322 representing a L2 data state, and a population of memory cells 323 representing a L3 data state. In addition, the LP programmed memory cells 312b might be programmed to their respective desired data states corresponding to a population of memory cells 324 representing a L4 data state, a population of memory cells 325 representing a L5 data state, a population of memory cells 326 representing a L6 data state, and a population of memory cells 327 representing a L7 data state as illustrated in FIG. 6.

Figure 8A:
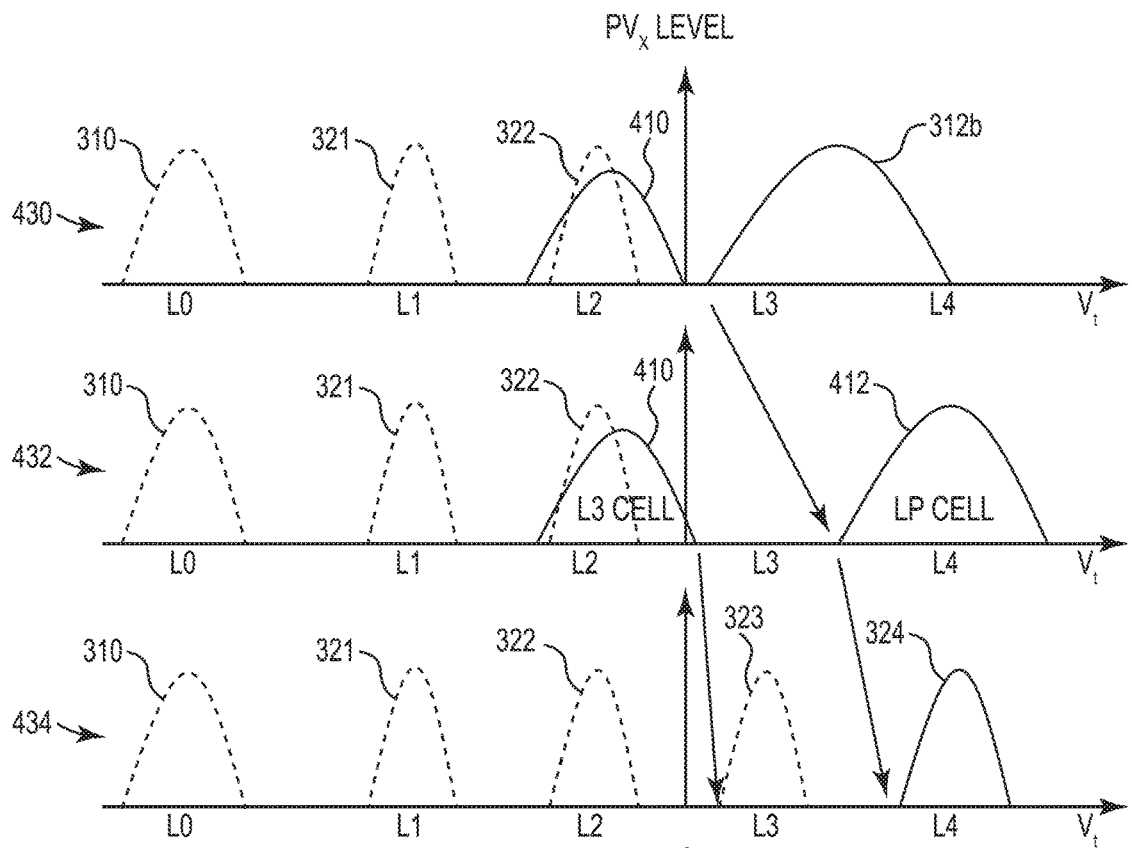
FIGS. 8A-8B depict a parallel programming operation according to another embodiment.
Figure 8B:
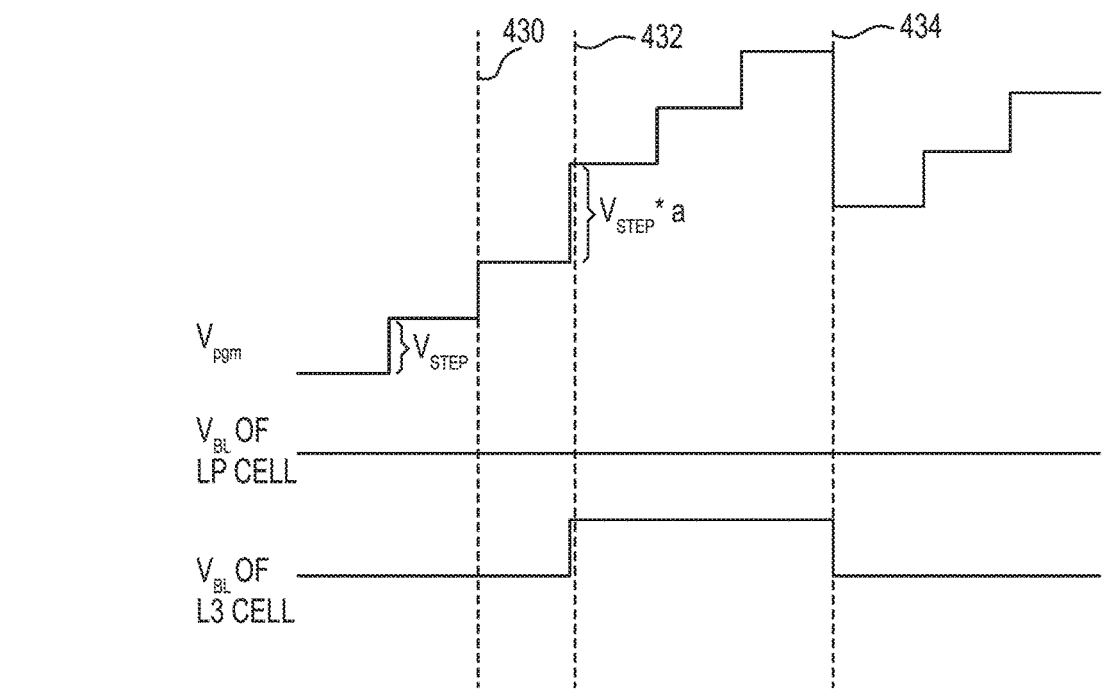

FIGS. 8A-8B depict a parallel programming operation according to another embodiment for the programming operation described with reference to FIG. 6. In this embodiment, a controller (e.g., control logic 116 of FIG. 1) may be configured to inhibit programming of the memory cells to be programmed to a lower level (e.g., L3 data state) during programming of the memory cells to be programmed to a higher level (e.g., L4 data state) and then resume programming of the memory cells to be programmed to the lower level.

As illustrated in FIGS. 8A and 8B at 430, the second pass of the multiple-pass programming operation begins by programming the memory cells to be programmed to the lower levels (e.g., L1 and L2). A bit line voltage $V_{BL}$ (e.g., 0V) is applied to the bit lines of the memory cells to be programmed including the LP programmed memory cells and the memory cells to be programmed to the L1, L2, and L3 data states. Programming pulses $V_{PGM}$ are then applied to the selected word line to move selected L0 programmed memory cells 310 to the L1 data state 321, to the L2 data state 322, and toward the L3 data state as indicated at 410. When the memory cells to be programmed to the L3 data state as indicated at 410 begin to pass a predefined threshold voltage level $PV_X$ as indicated at 432, the memory cells to be programmed to the L3 data state and the L4 data state may be programmed in parallel.

In one example, the number of memory cells reaching the $PV_X$ level may be counted until the number exceeds a predefined number. In response to the number of memory cells reaching the $PV_X$ level exceeding the predefined number as indicated at 432, the program voltage $V_{PGM}$ as illustrated in FIG. 8B may be increased by a voltage step $V_{STEP}$*a, where "a" is greater than or equal to 1. At the same time $V_{PGM}$ is increased by $V_{STEP}$*a, the bit line voltage of the memory cells to be programmed to the L3 data state is increased to another voltage (e.g., Vcc) to inhibit programming of the memory cells to be programmed to the L3 data state. With the programming of the memory cells to be programmed to the L3 data state inhibited, the LP programmed memory cells 312b are programmed toward the L4 data state as indicated at 412.

Once the memory cells for the L4 data state are programmed, the programming of the memory cells to be programmed to the L3 data state resumes. The programming of the memory cells to be programmed to the L3 data state resumes as indicated at 434 by lowering the bit line voltage of the memory cells to be programmed to the L3 data state to equal the bit line voltage of the LP programmed memory cells (e.g., 0V). At the same time the bit line voltage of the memory cells to be programmed to the L3 data state is lowered, the programming voltage $V_{PGM}$ may also be reduced to the program voltage of the L3 data state and the programming continues. Thus, a gap in the threshold voltage may be maintained between the memory cells to be programmed to the L3 data state and the memory cells to be programmed to the L4 data state. Accordingly, the threshold voltage of the population of memory cells 323 programmed to the L3 data state do not overlap the threshold voltage of the population of memory cells 324 programmed to the L4 data state as indicated at 434, even if power is lost during the second pass of the multiple-pass programming operation and the programming of the higher page data is reinstated after power is restored.

As a result, in the second pass of the multiple-pass programming operation a portion of the L0 programmed memory cells 310 might be programmed to their respective desired data states corresponding to a population of memory cells 321 representing a L1 data state, a population of memory cells 322 representing a L2 data state, and a population of memory cells 323 representing a L3 data state. In addition, the LP programmed memory cells 312b might be programmed to their respective desired data states corresponding to a population of memory cells 324 representing a L4 data state, a population of memory cells 325 representing a L5 data state, a population of memory cells 326 representing a L6 data state, and a population of memory cells 327 representing a L7 data state as illustrated in FIG. 6.

Figure 9:
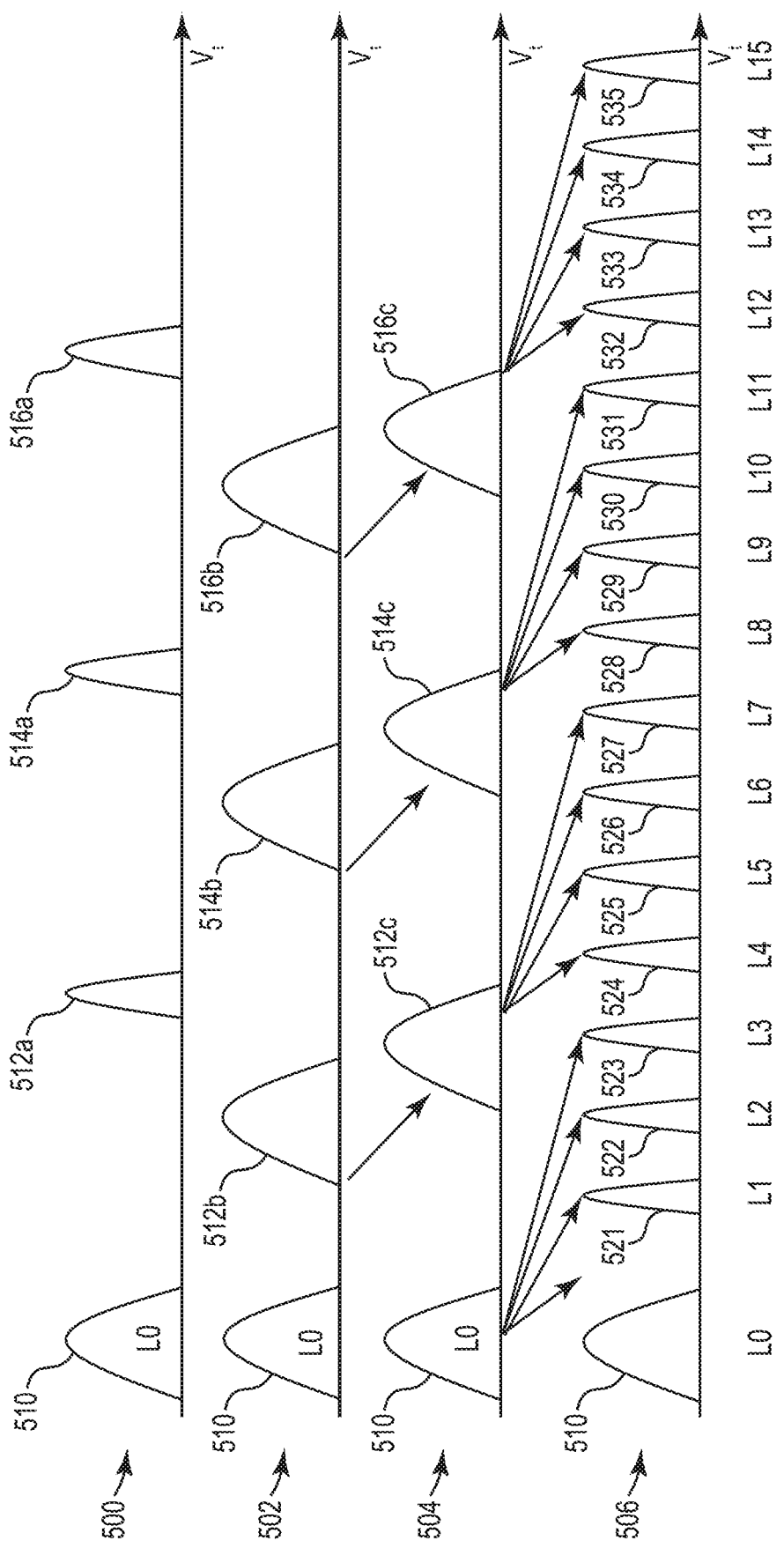
FIG. 9 depicts representations of populations of memory cells at various stages of a programming operation according to another embodiment.

FIG. 9 depicts representations of populations of memory cells at various stages of a programming operation according to another embodiment. In this embodiment, a controller (e.g., control logic 116 of FIG. 1) may be configured to program the multiple-level memory cells via a multiple-pass programming operation. The multiple-pass programming operation programs lower page data to the memory cells in a first pass and reprograms the lower page data to the memory cells and programs higher page data to the memory cells in a second pass as described below for a quad-level cell (QLC) memory. A QLC memory may store four bits of data per memory cell where the lower page data may include the lower two bits of data.

The memory cells of a page of memory cells might be erased to each have a threshold voltage representing an erased data state. This population of erased memory cells is indicated at 510 and represent a L0 data state. The first pass, indicated at 550, of a programming operation for a QLC memory might involve loading lower page data and programming that lower page data. As a result, the population of memory cells might be programmed to their respective desired data states corresponding to a population of memory cells 510 representing the L0 data state, a population of memory cells 512a representing a first LP data state, a population of memory cells 514a representing a second LP data state, and a population of memory cells 516a representing a third LP data state. After the first pass, as indicated at 502, the threshold voltage of the LP programmed memory cells 512a, 514a, and 516a may shift down as indicated by a populations of memory cells 512b, 514b, and 516b, respectively.

The second pass, indicated at 504, of the programming operation for the QLC memory might involve first reprogramming the lower page data. As a result, the threshold voltages of the LP programmed memory cells 512b, 514b, and 516b are shifted back up as indicated by the populations 512c, 514c, and 516c, respectively, of LP programmed memory cells. The reprogramming of the LP programmed memory cells may include programming by a program-verify operation or by blind pulses without a verify operation.

The second pass of the programming operation then may continue, as indicated at 506, which might involve loading higher page data (e.g., upper page data and extra page data) and programming that higher page data. As a result, a portion of the L0 programmed memory cells 510 might be programmed to their respective desired data states corresponding to a population of memory cells 521 representing a L1 data state, a population of memory cells 522 representing a L2 data state, and a population of memory cells 523 representing a L3 data state. A portion of the first LP programmed memory cells 512c might be programmed to their respective desired data states corresponding to a population of memory cells 524 representing a L4 data state, a population of memory cells 525 representing a L5 data state, a population of memory cells 526 representing a L6 data state, and a population of memory cells 527 representing a L7 data state.

A portion of the second LP programmed memory cells 514c might be programmed to their respective desired data states corresponding to a population of memory cells 528 representing a L8 data state, a population of memory cells 529 representing a L9 data state, a population of memory cells 530 representing a L10 data state, and a population of memory cells 531 representing a L11 data state. Likewise, a portion of the third LP programmed memory cells 516c might be programmed to their respective desired data states corresponding to a population of memory cells 532 representing a L12 data state, a population of memory cells 533 representing a L13 data state, a population of memory cells 534 representing a L14 data state, and a population of memory cells 535 representing a L15 data state.

However, due to the threshold voltage of the LP programmed memory cells 512c, 514c, and 516c having been shifted up, the L3 programmed memory cells 523 do not overlap the first LP programmed memory cells 512c, the L7 programmed memory cells 527 do not overlap the second LP programmed memory cells 514c, and the L11 programmed memory cells 531 do not overlap the third LP programmed memory cells 516c. If a power loss occurs before completing programming of the higher page data, the L3 programmed memory cells 523 can be distinguished from the first LP programmed memory cells 512c, the L7 programmed memory cells 527 can be distinguished from the second LP programmed memory cells 514c, and the L11 programmed memory cells 531 can be distinguished from the third LP programmed memory cells 516c when power is restored. Thus, when programming of the higher page data is reinstated when power is restored, no data is lost.

While the above example for QLC memory describes the reprogramming of the lower page data in the second pass of a multiple-pass programming operation similar to the TLC memory programming example as described with reference to FIG. 4, the TLC memory programming examples described with reference to FIG. 5-8B may also be used to program a QLC memory.

Figure 10A:
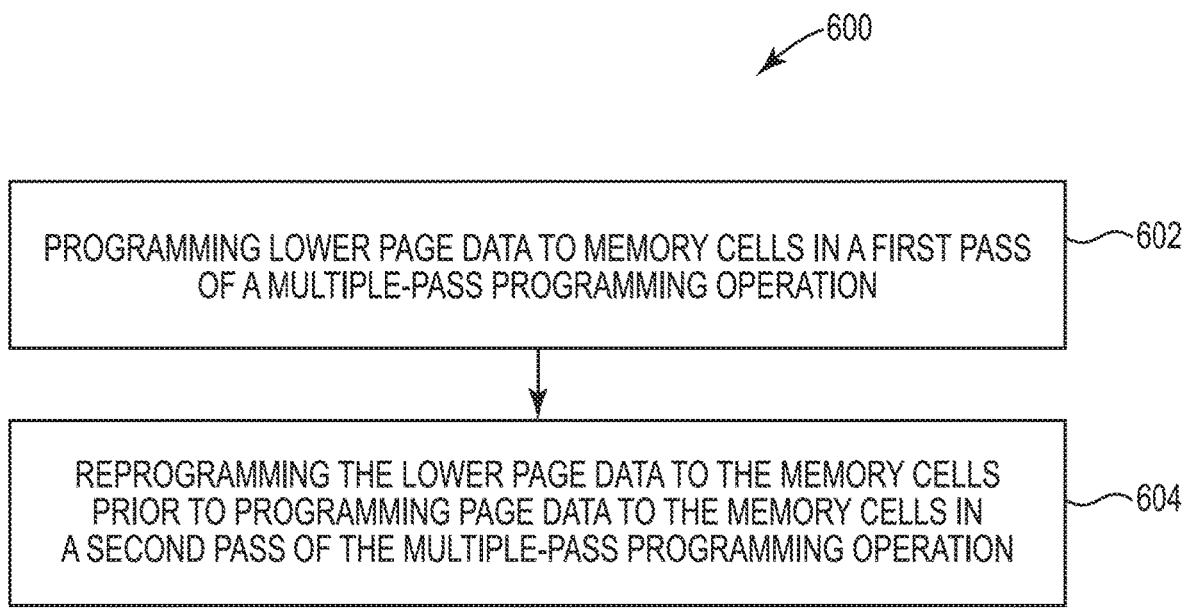
FIGS. 10A-10B are flow diagrams illustrating one embodiment of a method for programming multiple-level memory cells.
Figure 10B:
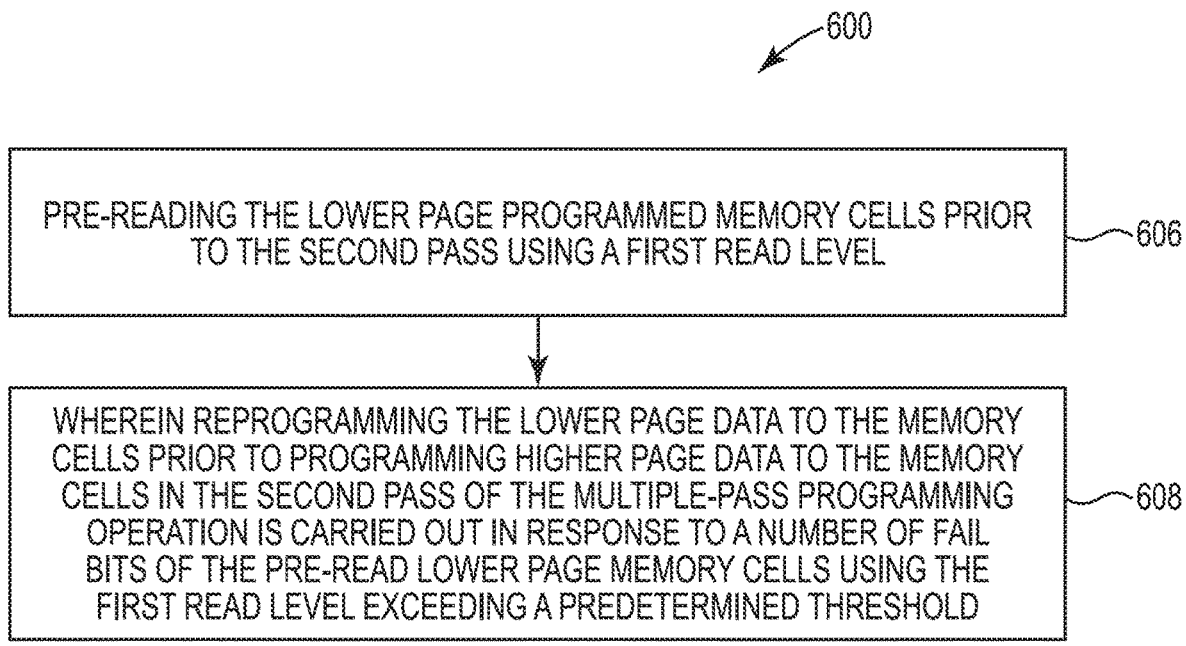

FIGS. 10A-10B are flow diagrams illustrating one embodiment of a method 600 for programming multiple-level memory cells. In one example, method 600 may be implemented by memory device 100 of FIG. 1. As illustrated in FIG. 10A, at 602 method 600 includes programming lower page data to memory cells in a first pass of a multiple-pass programming operation. At 604, method 600 includes reprogramming the lower page data to the memory cells prior to programming higher page data to the memory cells in a second pass of the multiple-pass programming operation. In one example, programming the higher page data to the memory cells in the second pass may include programming the higher page data to the memory cells in the second pass such that in response to power being restored after a power loss during the second pass, programming of the higher page data to the memory cells is reinstated. Programming the higher page data to the memory cells may include programming upper page data and extra page data to the memory cells in the second pass.

As illustrated in FIG. 10B, at 606 method 600 may further include pre-reading the lower page programmed memory cells prior to the second pass using a first read level. At 608, method 600 may further include wherein reprogramming the lower page data to the memory cells prior to programming higher page data to the memory cells in the second pass of the multiple-pass programming operation is carried out in response to a number of fail bits of the pre-read lower page memory cells using the first read level exceeding a predetermined threshold (e.g., a number of fail bits exceeding the number that may be corrected via an error correction code).

FIGS. 11A-11B are flow diagrams illustrating another embodiment of a method 700 for programming multiple-level memory cells. In one example, method 700 may be implemented by memory device 100 of FIG. 1. As illustrated in FIG. 11A, at 702 method 700 includes programming lower page data to memory cells in a first pass of a multiple-pass programming operation. At 704, method 700 includes programming higher page data to the memory cells in a second pass of the multiple-pass programming operation such that higher page data subject to (i.e., programmed from) the programmed lower page data is programmed prior to higher page data subject to erase data. In one example, programming the higher page data to the memory cells in the second pass may include programming the higher page data to the memory cells in the second pass such that in response to power being restored after a power loss during the second pass, programming of the higher page data to the memory cells is reinstated. Programming the higher page data to the memory cells may include programming upper page data and extra page data to the memory cells in the second pass.

As illustrated in FIG. 11B, at 706 method 700 may further include pre-reading the lower page programmed memory cells prior to the second pass using a first read level. At 708, method 700 may further wherein reprogramming the lower page data to the memory cells prior to programming higher page data to the memory cells in the second pass of the multiple-pass programming operation is carried out in response to a number of fail bits of the pre-read lower page memory cells using the first read level exceeding a predetermined threshold (e.g., a number of fail bits exceeding the number that may be corrected via an error correction code).

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method for programming multiple-level memory cells, the method comprising:

programming lower page data to memory cells in a first pass of a multiple-pass programming operation to program the memory cells to respective desired threshold voltages; and reprogramming the lower page data to the memory cells to reprogram the memory cells back to the respective desired threshold voltages after the threshold voltages of the memory cells have shifted down due to a time interval after the first pass prior to programming higher page data to the memory cells in a second pass of the multiple-pass programming operation, wherein programming the higher page data to the memory cells in the second pass comprises programming the higher page data to the memory cells in the second pass such that in response to power being restored after a power loss during the second pass, programming of the higher page data to the memory cells is reinstated.

2. The method of claim 1, further comprising:

pre-reading the lower page programmed memory cells prior to the second pass using a first read level, wherein reprogramming the lower page data to the memory cells prior to programming higher page data to the memory cells in the second pass of the multiple-pass programming operation is carried out in response to a number of fail bits of the pre-read lower page memory cells using the first read level exceeding a predetermined threshold.

3. The method of claim 1, wherein programming the higher page data to the memory cells comprises programming upper page data and extra page data to the memory cells in the second pass.

4. A memory device comprising:

an array of multiple-level memory cells; and a controller configured to program the multiple-level memory cells via a multiple-pass programming operation, the multiple-pass programming operation to program lower page data to the memory cells in a first pass to program the memory cells to respective desired threshold voltages and reprogram the lower page data to the memory cells to reprogram the memory cells back to the respective desired threshold voltages after the threshold voltages of the memory cells have shifted down due to a time interval after the first pass and program higher page data to the memory cells in a second pass, wherein the controller is configured to, in response to power being restored after a power loss during the second pass, reinstate programming of the higher page data to the memory cells.

5. The memory device of claim 4, wherein the controller is configured to skip the reprogramming of the lower page data to the memory cells in the second pass in response to a threshold voltage of the lower page programmed memory cells being above a predetermined threshold voltage.

6. The memory device of claim 4, wherein the controller is configured to program the multiple-level memory cells as triple level memory cells.

7. The memory device of claim 4, wherein the controller is configured to program the multiple-level memory cells as quad level memory cells.

* * * * *